United States Patent
Malone

(10) Patent No.: US 6,894,900 B2
(45) Date of Patent: May 17, 2005

(54) HEAT SINK WITH HEAT PIPE AND BASE FINS

(75) Inventor: Christopher G. Malone, Folsom, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/246,322

(22) Filed: Sep. 17, 2002

(65) Prior Publication Data

US 2004/0052051 A1 Mar. 18, 2004

(51) Int. Cl.[7] .............................................. H05K 7/20
(52) U.S. Cl. ................. 361/700; 174/15.2; 165/104.33; 165/80.3; 361/703
(58) Field of Search ....................... 174/15.2; 165/80.2, 165/80.3, 104.26, 104.33; 257/714–716; 316/689, 697–703

(56) References Cited

U.S. PATENT DOCUMENTS

| | | | |
|---|---|---|---|
| 5,598,320 A | | 1/1997 | Toedtman et al. |
| 5,699,853 A | * | 12/1997 | Goth et al. ............ 165/104.33 |
| 5,949,647 A | | 9/1999 | Kolman et al. |
| 6,021,044 A | * | 2/2000 | Neville, Jr. et al. ......... 361/700 |
| 6,377,459 B1 | | 4/2002 | Gonsalves et al. |
| 6,385,044 B1 | | 5/2002 | Colbert et al. |
| 6,394,175 B1 | * | 5/2002 | Chen et al. ............ 165/104.33 |
| 6,469,894 B2 | | 10/2002 | Ubukata |
| 2001/0001981 A1 | | 5/2001 | Ueda et al. |

FOREIGN PATENT DOCUMENTS

| | | |
|---|---|---|
| GB | 0320063.1 | 10/2003 |
| GB | 0320066.4 | 10/2003 |
| JP | 57042154 | 3/1982 |
| JP | 58033859 | 2/1983 |
| JP | 9126669 | 5/1997 |
| JP | 9331177 | 12/1997 |
| JP | 11083355 | 3/1999 |
| JP | 11317482 | 11/1999 |
| JP | 11351769 | 12/1999 |
| JP | 2000040891 | 2/2000 |
| JP | 2002064170 | 2/2000 |
| JP | 2001223308 | 8/2001 |
| JP | 2001267772 | 9/2001 |
| JP | 2002151636 | 5/2002 |

OTHER PUBLICATIONS

UK Search Report dated Oct. 24, 2003; Hewlett–Packard.

* cited by examiner

Primary Examiner—Gregory Thompson

(57) ABSTRACT

A heat sink includes at least one heat pipe attached to a base having a substantially flat region for interfacing with an electronic component. Additionally, the heat sink comprises fins attached to the base and at least one heat pipe. The fins and the base may be integral with or attached to each other. Such a heat sink can dissipate heat from one or more electronic components more efficiently as the heat pipe coupled with the fins attached to the base provide alternate heat transfer paths for heat generated by electronic components.

20 Claims, 3 Drawing Sheets

HEAT SINK WITH HEAT PIPE AND BASE FINS

CROSS-RELATED APPLICATIONS

This application is related to U.S. patent application Ser. No. 10/246,343, for HEATSINK WITH HEAT PIPE IN DIRECT CONTACT WITH COMPONENT and U.S. patent application Ser. No. 10/246,299, for HEATSINK WITH ANGLED HEAT PIPE, which were filed concurrently on Sep. 17, 2002, and which are hereby incorporated by reference in their entirety.

BACKGROUND OF THE INVENTION

It is well known that an electronic component generates heat as it operates. As the generated heat increases above a critical temperature, a failure can occur in the operation of the electronic component. Therefore, the excess heat must be dissipated to prevent such failures.

One type of heat sink used to dissipate heat includes a heat pipe. A heat pipe is a vacuum-sealed pipe that is filled with a heat-transfer liquid, such as water, and has the interior wall of the heat pipe covered with a wicking material. As the electronic component heats up, the "hot" end of the heat pipe closest to the electronic component also heats up. The liquid near the hot end of the heat pipe eventually evaporates and the resultant vapor collects at the "cool" end of the heat pipe where the vapor then condenses. The condensed liquid flows back to the hot end of the heat pipe via the wicking. Evaporating liquid again migrates to the cool end of the heat pipe. This evaporating/condensing cycle repeats as the heat pipe transfers heat so efficiently that the hot end of the heat pipe is kept at or near the same temperature as the cool end. Furthermore, because the boiling point of the fluid changes with the pressure, the vacuum within the heat pipe can be set such that boiling occurs at a desired temperature.

A heat pipe is typically designed for a specific electronic component. For example, the base of the heat pipe is typically the same or approximately the same shape and area as the surface area of the component to be cooled. Therefore, components having different surface areas and/or shapes typically need heat pipes that are specifically designed for those particular areas and shapes. Most prior-art heat pipes used in component cooling have a relatively large diameter (greater than ¼ of an inch). Furthermore, sometimes the bases of these heat pipes are rectangular and the heat pipe itself is round so the base-pipe interface may have a complex design. For example, the rectangular base may have a hollow interior that joins the interior of the cylindrical heat pipe. Alternatively, the base is solid with the heat pipe mounted to the base. This, however, is less efficient due to the added thermal resistance of the base and the material (e.g. adhesive) used to attach the heat pipe to the base.

The diameter of the heat pipe affects the amount of heat transfer through the heat sink assembly. As the projected planar surface area of a heat pipe increases with its diameter, the increase in diameter increases the air resistance, as the air is forced to flow around the pipe, thus reducing the air cooling effects.

Yet another problem with a heat pipe is that it can fail by forming a leak such that the vacuum pressure decreases, possibly by corrosion of the wicking material, contamination of the fluid, etc. As a result, when a heat pipe fails, it becomes less effective at transferring heat from the electronic component to the ambient environment and thus becomes less effective in cooling the component. If the failure of the heat pipe is severe enough, the component can overheat and fail.

SUMMARY OF THE INVENTION

According to an embodiment of the invention, a heat sink includes at least one heat pipe attached to a base having a substantially flat region for interfacing with a heat-generating component. Additionally, the heat sink comprises a number of fins attached the base and at least one heat pipe.

Such a heat sink can dissipate heat from one or more heat-generating components more efficiently because of the heat pipe and the fins working in tandem to transfer heat from the heat-generating source. A heat pipe is a device that provides an efficient way of cooling heat-generating components as heat is transferred from the heat-generating component by means of a liquid/gas evaporation/condensation cycle. Additionally, fins attached to the base of the heat sink provide even more surface area for dissipating heat from a heat source. The heat pipe and fins combination transfers heat from heat-generating components more efficiently than either a heat pipe alone or fins alone.

DETAILED DESCRIPTION OF THE PREFERRED EMBODIMENT

The following discussion is presented to enable one skilled in the art to make and use the invention. Various modifications to the disclosed embodiments will be readily apparent to those skilled in the art, and the generic principles herein may be applied to other embodiments and applications without departing from the spirit and scope of the present invention as defined by the listed claims. Thus, the present invention is not intended to be limited to the embodiments shown, but is to be accorded the widest scope consistent with the principles and features disclosed herein.

Figure 1:
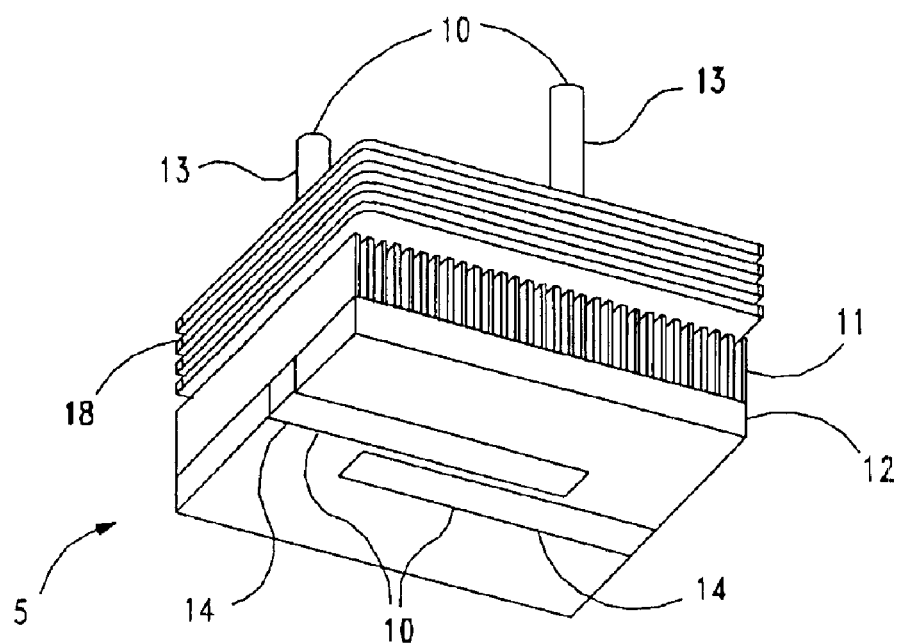
FIG. 1 is an isometric view of a heat sink having a heat pipe that can directly contact a heat-generating component in accordance with an embodiment of the invention.

FIG. 1 is an isometric view of a heat sink 5 according to an embodiment of the invention. The heat sink 5 comprises multiple heat pipes although alternative embodiments only include one heat pipe. According to this embodiment, there are two heat pipes 10 attached to a base 12. A heat pipe 10 is attached to the base 12 in any conventional manner, including adhesive, form-fitted ("snap-on"), harnessed, bolted, etc.

The base 12 is of any shape suitable to be attached to a heat generating component, such as, for example, an electronic component mounted to a printed circuit board (not shown). A heat-generating component is any device capable of generating heat that is undesirable; most typically, an electronic component such as a central processing unit, for example. The base 12 is integral, i.e., formed as a continuous body of material that has a high propensity for conducting heat although the base 12 may be formed in multiple attached pieces, i.e. non-integral.

The base 12 can be formed from materials such as aluminum, copper, and/or other metal alloys, plastic and/or epoxy, and/or any other suitable heat conducting material. In one embodiment, the base 12 is formed from a continuous piece of aluminum alloy and its bottom is shaped to fit the contour of one or more electronic components. In another embodiment, the base 12 is formed from two different materials, such as for example, aluminum in a first region and copper in a second region. The two regions are attached together by a conventional means such as bolting or gluing with heat-conductive adhesive.

The heat sink 5 also includes vertical fins 11 that are attached to the base 12 and are intended to increase the heat sink's surface area in order to increase ambient-air cooling effects, such as convective heat dissipation. By increasing the ambient-air surface contact, heat is dissipated from the electronic component through the heat sink and to the ambient air more efficiently. In this embodiment, the vertical fins 11 extend at least as far as the bend radius of the heat pipes 10. The vertical fins 11 also reduce the thickness of the base 12, which reduces costs and increases cooling. The vertical fins 11 are formed by either machining a solid base block (e.g. integral or skived fins) or by being attached to the base 12 in a conventional manner (e.g. folded fins).

As previously stated, the vertical fins 11 are formed from the base 12 up to the point where the bends in the heat pipes 10 stop. Therefore, a second set of horizontal fins 18 can be disposed about the heat pipes 10, wherein the horizontal fins 18 come in contact with the vertical fins 11 when the horizontal fins are attached to the heat sink 5. The horizontal fins 18 are typically press-on fins that are pressed onto the pipes 10. By convention, horizontal fins are fins machined to form fit around one or more heat pipes 10, such that friction holds the horizontal fins 18 in place and flange spacers are used to maintain space between horizontal fins when assembled. Alternatively, the horizontal fins 18 are attached in another conventional manner, such as adhesive or harnessing. The horizontal fins 18 may be detachable from the heat sink 5. By positioning the vertical fins 11 and horizontal fins 18 all along the vertical length of the heat pipes 10, the heat-dissipation rate of the heat sink 5 is increased.

Still referring to FIG. 1, two heat pipes 10 are attached to the base 12 such that the base aligns the cool end 13 of each heat pipe 10 substantially perpendicular to the bottom plane of the base and the hot end 14 of the heat pipes 10 substantially parallel to the bottom plane of the base. Furthermore, the hot end 14 of each heat pipe 10 is exposed along the bottom of the base 12 such that any heat-generating component that the heat sink is attached to is in direct contact with the hot end 14 of each heat pipe 10. In one embodiment, the hot end 14 of each heat pipe 10 is flat and is flush with the bottom of the base 12. By attaching a heat sink 5 with the hot end 14 of each heat pipe exposed through the bottom of the base 12, the direct contact with a heat-generating component allows for better thermal efficiency. The remaining portion of the bottom plane of the base 12 still remains in contact with the heat-generating component as well; however, the heat pipes 10 are applying a far more efficient means of heat dissipation. Thus, the more surface area of a heat pipe 10 that is in direct contact with a component assembly, heat will be dissipated more efficiently from the component and increasing the contact surface area allows each heat pipe 10 having a relatively small diameter to dissipate heat as efficiently as a conventionally mounted heat pipe having a larger diameter.

Figure 2:
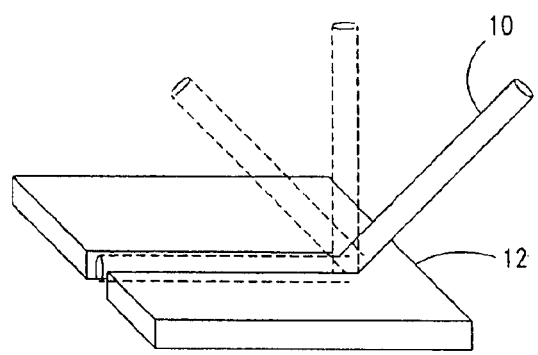
FIG. 2 is a side view of a heat sink having a heat pipe with a bend in accordance with an embodiment of the invention.

FIG. 2 shows a heat pipe 10 attached to a heat sink base 12 with a bend according to an embodiment of the invention. A heat pipe can be bent at any angle from 0° to 180° with respect to the plane of the bottom of the base 12. Typically, each heat pipe 10 is designed such that the radius of curvature with which the heat pipe 10 is bent is gradual enough so that a pinching off of the interior of the heat pipe 10 does not occur. For example, the heat pipe 10 is shown in solid line with a bend of approximately 145° and in broken line, at angles of 90° (as shown in FIG. 1) and 45°.

By bending a heat pipe 10 in an L-shape (one 90° angle as shown in FIG. 1) or U-shape (two 90° angles as not shown), a significantly larger portion of the heat pipe 10 can be in direct contact with a heat-generating component than if the heat pipe 10 were not bent.

Alternatively, the hot end 14 of the heat pipe 10 (i.e. the end of the heat pipe 10 disposed within the base 12 as shown in FIG. 1) may be spirally shaped or may have any other shape that increases the surface area of the heat pipe 10 in contact with the heat-generating component being cooled.

Using smaller diameter heat pipes 10 allows multiple heat pipes 10 to be used within a single heat sink 5, thus increasing thermal efficiency. Additionally, multiple heat pipes 10 provide redundancy in a heat sink 5. That is, when a heat pipe 10 failure occurs, e.g. a leak, the other heat pipes 10 continue to dissipate heat, thus preventing overheating of the heat-generating component being cooled. Smaller-diameter heat pipes 10 are also generally cheaper and more widely available than larger-diameter heat pipes 10. For example, ¼"-diameter heat pipes 10 can be purchased "off the shelf" and can be bent into desired shapes. Then, the heat pipes 10 will be attached to a pre-formed base 12 that has been designed for a particular heat-generating component. Once, the heat sink 5 has been assembled, it can be mounted to a heat generating component, as is described below with respect to FIG. 3.

Moreover, smaller-diameter heat pipes 10 can be arranged to be less restrictive of the airflow within a typical electronic-system enclosure as compared to one or more larger-diameter heat pipes 10. For example, a typical electronic system includes a fan to circulate air over the heat sinks within the enclosure. This circulating air allows the heat sinks to dissipate heat more efficiently. A large-diameter heat pipe has a larger cross-sectional area that is perpendicular to the airflow, and thus impedes the air flow more than a smaller-diameter heat pipe that has less cross-sectional area. Unfortunately, the more the airflow is impeded, the thermal efficiency decreases. But by aligning multiple smaller-diameter pipes, one behind another, in a direction parallel to the airflow, one can achieve the thermal efficiency of a larger-diameter heat flow while reducing the impedance to the airflow. This may allow one to reduce the cost of the cooling system by reducing the size of the fans or to reduce the energy consumed by the cooling system by reducing the fan speed.

Figure 3:
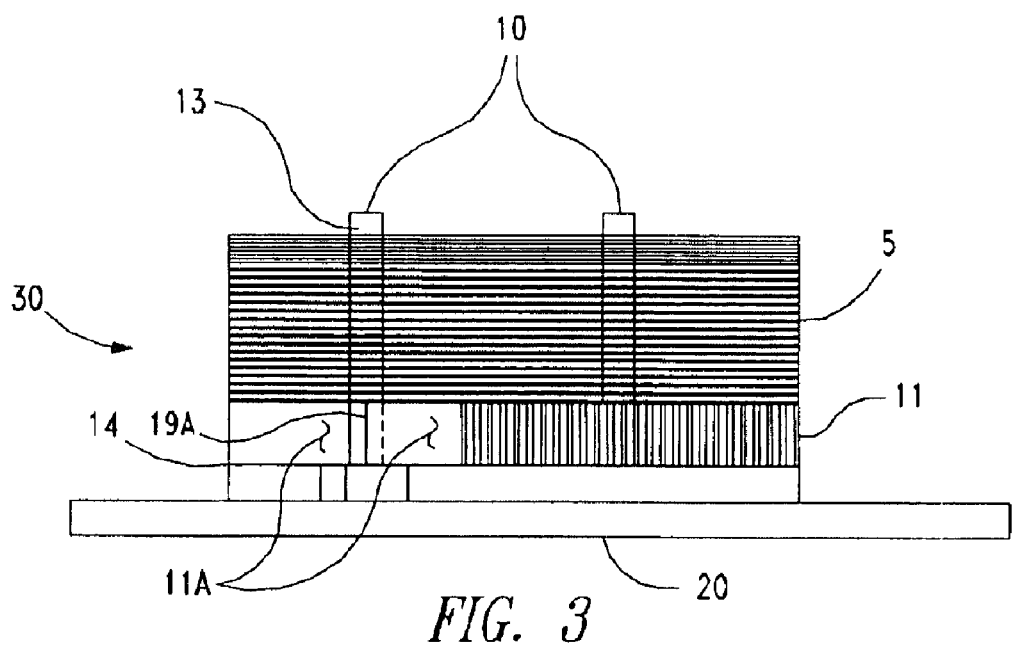
FIG. 3 is a side view of a heat sink assembly that includes the heat sink of FIG. 1 in accordance with an embodiment of the invention.

FIG. 3 is a side perspective view of a heat-sink assembly 30 that includes the heat sink of FIG. 1 and a heat-generating component 20 according to an embodiment of the invention. The heat sink 5 is mounted to the heat-generating component 20 such that the hot end 14 of each L-shaped heat pipe 10 is in direct contact with the heat-generating component 20. FIG. 3 includes a cut-away portion where the vertical fins 11 of FIG. 1 in front of the left heat pipe 10 are omitted for illustration purposes. The cut-away exposes a heat pipe-fin attachment region 19A between the left heat pipe 10 and a proximal portion of a fin 11A. A corresponding heat pipe-fin attachment between a distal portion of the fin 11A and the left heat pipe 10 is obscured by the left heat pipe. The embodiment illustrated in FIG. 3 includes a set of straight, parallel vertical fins 11 that are saced more closely together than the diameters of the heat pipes 10. This results in at least two fins, including the fin 11A, intersecting and being attached to the left heat pipe 10 where the left heat pipe passes through the vertical fins 11. Respective fins 11 are attached to the right heat pipe 10 in a similar manner.

Still referring to FIG. 3, in one embodiment of the invention, the attachment region 19A represents a conventional, thermally conductive, direct attachment between the vertical fin 11A and the left heat pipe 10. Examples of such attachment include a force, press-on, or friction fit, and an attachment augmented by a thermal adhesive. An example of the latter is where the aperture through the fins 11 (through which the left heat pipe extends) is larger than the diameter of the left heat pipe 10, and a thermally conductive adhesive fills any void and directly attaches the fin 11A to the left heat pipe. Also, where the spacing between fins 11 is substantially the same as the diameter of the left heat pipe 10 (this spacing not shown) then the left heat pipe may be press fit between adjacent fins such that the outside of the pipe is in direct contact with these fins. Alternatively, thermal adhesive may be used, particularly where the fins 11 are spaced farther apart than the diameter of the left heat pipe 10. The right heat pipe 10 may be similarly attached to respective ones of the fins 11.

Figure 4:
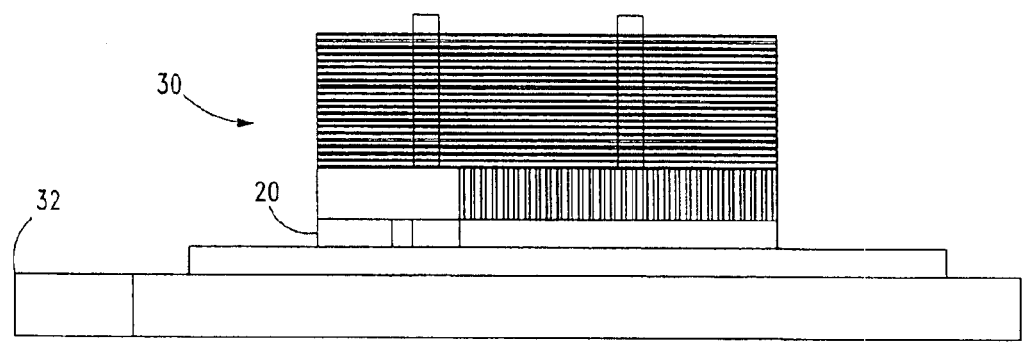
FIG. 4 is a side view of a circuit-board assembly that includes an alternative embodiment of the heat sink assembly of FIG. 3 attached to multiple heat generating components in accordance with one embodiment of the invention.

FIG. 4 is a side view of a circuit board assembly 35 that includes the heat sink assembly 30 of FIG. 3 attached to a printed circuit board 32 according to an embodiment of the invention. The heat-sink assembly 30 is attached to the printed circuit board 32 such that heat generated by the heat-generating component 20 is electronically connected to one or more supply voltages (not shown) and other circuitry by conductive traces (not shown on the board).

Figure 5:
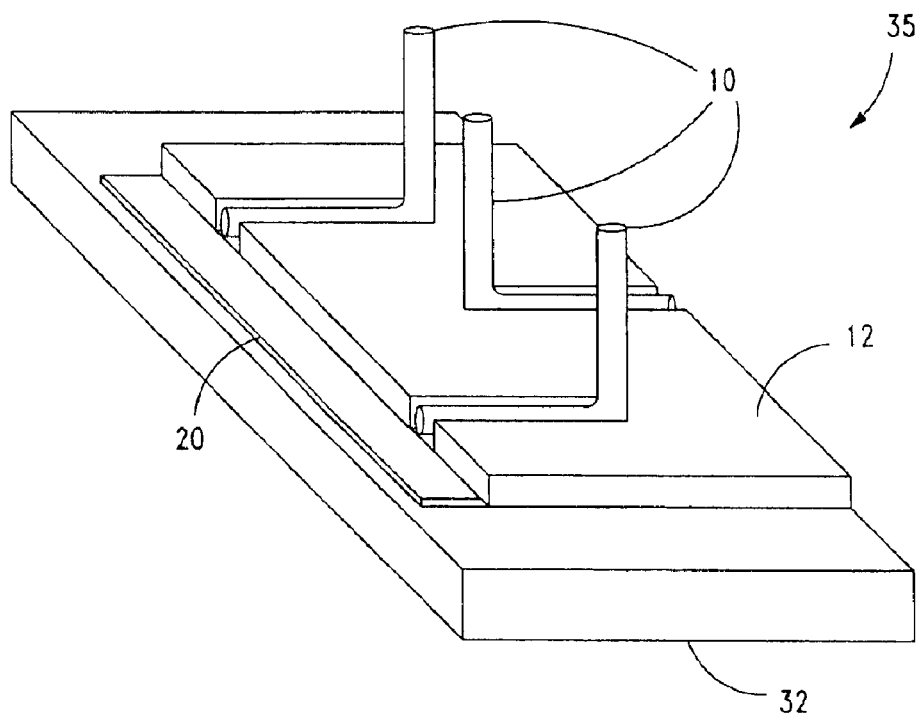
FIG. 5 is a side view of a circuit board assembly that includes the heat sink assembly of FIG. 3 attached to a printed circuit board containing a heat-generating component according to an embodiment of the present invention.

FIG. 5 shows an alternative embodiment of a circuit board assembly 35 according to an embodiment of the invention. In this embodiment, the printed circuit board 32 contains several heat-generating components 20. A heat sink 5 having multiple heat pipes 10 is shown mounted to the heat-generating components 20. In this embodiment, each heat pipe 10 is aligned with a heat-generating component 20, such that each heat pipe 10 which is exposed through the bottom of the common base 12 is in direct contact with its respective heat-generating component 20. Alternatively, each heat-generating component 20 may have multiple heat pipes 10 contacting it or each heat pipe 10 may contact multiple heat-generating components 20.

Figure 6:
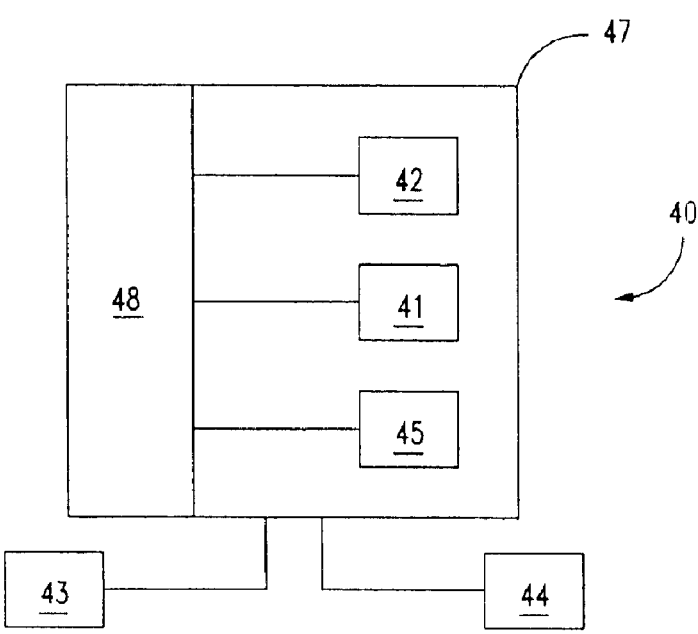
FIG. 6 is a block diagram of an electronic system that incorporates the circuit-board assembly of FIG. 3 in accordance with an embodiment of the invention.

FIG. 6 is a block diagram of an electronic system 40, such as a computer system, that incorporates one or more of the circuit-board assemblies 30 or 35 of FIGS. 3 and 4 according to an embodiment of the invention. For example purposes, however, the system 40 is discussed as having one or more of the circuit-board assemblies 30. The system 40 includes electronic circuitry 45, which typically comprises one or more circuit-board assemblies 30 that are mounted within an enclosure 47. One or more of these assemblies 30 typically includes a processor unit 41 and a memory 42. Coupled to the circuitry 45 are one or more data-storage devices 43 such as a disk drive, one or more input/output devices 44 such as a keyboard, or a display. Peripheral devices 43, 44, may also include circuit-board assemblies 30 in accordance with the invention.

What is claimed is:

1. A heat sink, comprising:
   (a) at least one heat pipe;
   (b) a base having a substantially flat region for interfacing with a heat-generating component, the base attached to said at least one heat pipe, the at least one heat pipe being substantially perpendicular to the base; and
   (c) a first set of fins directly attached to the base and at least one of the first set of fins directly attached and parallel to a portion of said at least one heat pipe.

2. The heat sink of claim 1 wherein said at least one heat pipe is longitudinal with a first region substantially parallel to the flat region of the base and a second region disposed between 0° and 180° to the flat region of the base.

3. A heat sink, comprising:
   (a) at least one heat pipe;
   (b) a base having a substantially flat region for interfacing with a heat-generating component, the base attached to said at least one heat pipe, the at least one heat pipe being substantially perpendicular to the base; and
   (c) a first set of fins attached to the base and to said at least one heat pipe, at least one of the first set of fins directly attached and parallel to a portion of said at least one heat pipe;
   (d) wherein said at least one heat pipe is longitudinal with a first region substantially parallel to the flat region of the base and a second region disposed between 0° and 180° to the flat region of the base; and
   (e) wherein the fins attached to the base protrude from the base in a substantially perpendicular direction and are at least as long as the bend radius of the two regions.

4. A heat sink, comprising:
   (a) at least one heat pipe;
   (b) a base having a substantially flat region for interfacing with a heat-generating component, the base attached to said at least one heat pipe, the at least one heat pine being substantially perpendicular to the base; and
      i) a first set of fins attached to the base and to said at least one heat pipe, at least one of the first set of fins directly attached and parallel to a portion of said at least one heat pie;
      ii) wherein said at least one heat pipe is longitudinal with a first region substantially parallel to the flat region of the base and a second region disposed between 0° and 180° to the flat region of the base; and
      iii) wherein said at least one heat pipe further comprises a third region located between the first and second regions, the third region having a disposition different than the disposition of the second region and between 0° and 180° to the flat region of the base.

5. A heat sink, comprising:
   (a) at least one heat pipe;
   (b) a base having a substantially flat region for interfacing with a heat-generating component, the base attached to said at least one heat pipe; and
   (c) a first set of fins attached directly to the base and directly to said at least one heat pipe; and
   (d) a second set of fins adapted to be attachable to the heat pipe.

6. The heat sink of claim 1 wherein the base is adapted to provide direct contact between said at least one heat pipe and the heat-generating component.

7. A heat transfer system, comprising:
   (a) a heat-generating component;

(b) a heat sink attached to the heat-generating component, the heat sink comprising:
  (i) a plurality of heat pipes;
  (ii) a base having a substantially flat region for interfacing with a heat-generating component, the base attached to at least one of said plurality of heat pipes, at least one said heat pipe being substantially perpendicular to the base; and
  (iii) fins directly attached to the base and at least one of the fins directly attached and parallel to a portion of at least one of said plurality of heat pipes.

8. The heat transfer system of claim 7 further comprising the base is adapted to provide direct contact between at least one of said plurality of heat pipes and the heat-generating component.

9. The heat sink of claim 7 wherein at least one heat pipe of the plurality of heat pipes is longitudinal with a first region substantially parallel to the flat region of the base and a second region disposed between 0° and 180° to the flat region of the base.

10. A heat transfer system, comprising:
  (a) a heat-generating component;
  (b) a heat sink attached to the heat-generating component, the heat sink comprising:
    (i) a plurality of heat pipes;
    (ii) a base having a substantially flat region for interfacing with a heat-generating component, the base attached to at least one of said plurality of heat pipes; and
    (iii) fins attached to the base and to at least one of said plurality of heat pipes;
    (iv) wherein at least one heat pipe of the plurality of heat pipes is longitudinal with a first region substantially parallel to the flat region of the base and a second region disposed between 0° and 180° to the flat region of the base; and
    (v) wherein the fins attached to the base protrude from the base in a substantially perpendicular direction and are at least as long as the bend radius between the first and second regions.

11. A heat transfer system, comprising:
  (a) a heat-generating component;
  (b) a heat sink attached to the heat-generating component, the heat sink comprising:
    (i) a plurality of heat pipes;
    (ii) a base having a substantially flat region for interfacing with a heat-generating component, the base attached to at least one of said plurality of heat pipes, the at least one heat pipe being substantially perpendicular to the base; and
    (iii) fins attached to the base and to at least one of said plurality of heat pipes, at least one of the fins directly attached and parallel to a portion of said at least one heat pipe;
    (iv) wherein at least one heat pipe of the plurality of heat pipes is longitudinal with a first region substantially parallel to the flat region of the base and a second region disposed between 0° and 180° to the flat region of the base; and
    (v) wherein at least one of said plurality of heat pipes further comprises a third region located between the first and second regions, the third region having a disposition different than the disposition of the second region and between 0° and 180° to the flat region of the base.

12. A circuit board assembly, comprising:
  (a) a printed circuit board with at least one heat-generating component; and
  (b) at least one heat sink attached to the heat-generating component, the heat sink comprising:
    (i) at least one heat pipe;
    (ii) a base having a substantially flat region for interfacing with a heat-generating component, the base attached to said at least one heat pipe, wherein said at least one heat pipe directly contacts said heat-generating component; and
    (iii) a first set of fins directly attached to the base and at least one of the fins of the first set directly attached to said at least one heat pipe.

13. A circuit board assembly, comprising:
  a. a printed circuit board with at least one heat-generating component; and
  b. at least one heat sink attached to the heat-generating component, the heat sink comprising:
    (i) at least one heat pipe;
    (ii) a base having a substantially flat region for interfacing with a heat-generating component, the base attached to said at least one heat pipe;
    (iii) a first set of fins attached directly to the base and directly to said at least one heat pipe; and
  (iv) a second set of fins adapted to be attachable to said at least one heat pipe.

14. A computer system, comprising:
  a. an enclosure; and
  b. a circuit board assembly disposed in the enclosure, the assembly comprising:
    (I) a printed circuit board having at least one heat-generating component; and
    (ii) at least one heat sink attached to the heat-generating component, the heat sink comprising:
      (aa) at least one heat pipe;
      (bb) a base having a substantially flat region for interfacing with a heat-generating component, the base attached to said at least one heat pipe, wherein said at least one heat pipe directly contacts said heat-generating component; and
      (cc) a first set of fins directly attached to the base and at least one of the fins of the first set directly attached to said at least one heat pipe.

15. A computer system, comprising:
  a. an enclosure; and
  b. a circuit board assembly disposed in the enclosure, the assembly comprising:
    (i) a printed circuit board having at least one heat-generating component; and
    (ii) at least one heat sink attached to the heat-generating component, the heat sink comprising:
      (aa) at least one heat pipe;
      (bb) a base having a substantially flat region for interfacing with a heat-generating component, the base attached to said at least one heat pipe; and
      (cc) a first set of fins attached directly to the base and directly to said at least one heat pipe; and
      (dd) a second set of fins adapted to be attachable to said at least one heat pipe.

16. A method for transferring heat comprising:
  (a) dissipating heat from a heat generating component through at least one heat pipe at a first rate of heat dissipation;
  (b) dissipating heat from the heat generating component through a base at a second rate of heat dissipation, the at least one heat pipe being substantially perpendicular to the base; and
  (c) dissipating heat from the heat generating component through a first set of fins at a third rate of heat dissipation, the first set of fins directly attached to the base and at least one of said first set of fins directly attached and parallel to a portion of said at least one heat pipe.

17. A method for transferring heat comprising:
a. dissipating heat from a heat generating component through at least one heat pipe at a first rate of heat dissipation;
b. dissipating heat from the heat generating component through a base at a second rate of heat dissipation; and
c. dissipating heat from the heat generating component through a first set of fins attached directly to the base and directly to said at least one heat pipe at a third rate of heat dissipation; and dissipating heat from the at least one heat generating component through a second set of fins at a fourth rate of heat dissipation.

18. A method of manufacturing a heat sink having a base, the method comprising:
(a) disposing a set of fins on the base, the fins being substantially perpendicular to the base; and
(b) attaching a heat pipe to the base and to at least one fin of the set of fins, the at least one fin directly attached and parallel to a portion of the heat pipe, the heat pipe being substantially perpendicular to the base.

19. The method of claim 18, wherein disposing the fins comprises forming the fins integrally with the base.

20. The method of claim 18, wherein disposing the fins comprises attaching the fins to the base.

* * * * *

UNITED STATES PATENT AND TRADEMARK OFFICE
CERTIFICATE OF CORRECTION

PATENT NO. : 6,894,900 B2
APPLICATION NO. : 10/246322
DATED : May 17, 2005
INVENTOR(S) : Christopher G. Malone It is certified that error appears in the above-identified patent and that said Letters Patent is hereby corrected as shown below:

IN THE SPECIFICATION

Column 5, line 9, delete "saced" and insert therefor --spaced--

IN THE CLAIMS

Claim 4, Column 6, line 38, delete "pine" and insert therefor --pipe--

Signed and Sealed this

Sixteenth Day of October, 2007

JON W. DUDAS
*Director of the United States Patent and Trademark Office*